United States Patent [19]

Aron

[11] Patent Number: 4,491,835
[45] Date of Patent: Jan. 1, 1985

[54] RASTER AND STROKE WRITING DEFLECTION AMPLIFIER ARRANGEMENT

[75] Inventor: Mitchell Aron, Harrington Park, N.J.

[73] Assignee: Allied Corporation, Morris Township, Morris County, N.J.

[21] Appl. No.: 361,316

[22] Filed: Mar. 24, 1982

[51] Int. Cl.³ ............................................. G09G 1/04
[52] U.S. Cl. .................................. 340/739; 340/723; 340/736; 315/403; 315/408
[58] Field of Search ............... 340/739, 720, 723, 721, 340/745, 736; 315/403, 408

[56] References Cited

U.S. PATENT DOCUMENTS

| | | | |
|---|---|---|---|
| 3,866,207 | 2/1975 | Goto | 340/736 X |
| 3,872,461 | 3/1975 | Jarosik | 340/736 X |
| 4,234,827 | 11/1980 | Willis | 315/408 |

Primary Examiner—James J. Groody
Assistant Examiner—Vincent P. Kovalick
Attorney, Agent, or Firm—Joseph E. Funk; Anthony F. Cuoco

[57] ABSTRACT

A Raster and Stroke Writing Deflection Amplifier Arrangement for a cathode ray tube (CRT) is disclosed which uses a conventional vertical oscillator and vertical deflection amplifier and a conventional horizontal oscillator and synchronous horizontal deflection amplifier, both driving deflection coils for providing vertical and low power horizontal scan operation for raster scan writing of data, and a flyback transformer and rectifier for providing the high D.C. voltage required by the CRT anode by rectification of high surge voltages created during horizontal retrace periods. During each vertical retrace period a switch connects the synchronous horizontal deflection amplifier to a dummy yoke at a zero crossing of the horizontal deflection signal for uninterrupted operation, connects a source of horizontal stroke writing signals amplified by a linear amplifier to the deflection coil, and also connects a source of vertical stroke writing signals to the vertical deflection amplifier to drive the deflection coil to accomplish stroke writing of information during each vertical retrace period.

8 Claims, 4 Drawing Figures

RASTER AND STROKE WRITING DEFLECTION AMPLIFIER ARRANGEMENT

FIELD OF THE INVENTION

This invention relates generally to raster scan cathode ray tube displays and more specifically to stroke writing during vertical retrace periods with such displays.

BACKGROUND OF THE INVENTION

Prior art television type raster scan cathode ray tube displays are used in certain applications wherein data to be displayed comes from two sources and this data is displayed during two sequential periods of time during the operation of the display. That is, during normal raster scan writing of data and then during each vertical retrace period. Typically, data written during the vertical retrace period is written using stroke writing techniques. The conventional vertical deflection amplifier is a linear amplifier that can be used for both raster and stroke writing operation. However, unlike the slow speed vertical deflection amplifier, the high speed horizontal deflection amplifier in most television raster displays is not a linear amplifier. The horizontal deflection amplifier functions as a power control or switching system which dissipates only a fraction of the large circulating wattless power required to deflect the beam in the horizontal direction. If a linear amplifier were used this large wattless power would be uselessly dissipated as heat in the deflection amplifier. Since a linear amplifier is required for stroke writing, the typical horizontal amplifier circuit cannot be used. Furthermore, in most television displays a portion of the horizontal retrace energy is used to generate the high voltage CRT anode potential and other potentials required in the display. If the horizontal deflection amplifier were to be used for stroke writing for any significant period, this power generating capability would not be possible, and a separate costly power supply would be required.

Thus, there is a need in the art for a horizontal raster deflection and stroke writing amplifier arrangement that minimizes power usage, and does not interfere with the ability to utilize the horizontal flyback energy as a D.C. power source.

SUMMARY OF THE INVENTION

The foregoing need of the prior art is satisfied by my invention. I provide a novel horizontal raster deflection and stroke writing amplifier arrangement that minimizes power usage and doesn't interfere with the use of the horizontal flyback energy to develop the high D.C. voltage required by the CRT anode. I utilize a first amplifier that is a conventional synchronous deflection amplifier having an input from a horizontal oscillator to provide a horizontal deflection signal to the horizontal coil of the deflection yoke on the neck of a cathode ray tube only during raster scan writing periods. During vertical retrace periods an electronic analog switch is used to disconnect synchronous horizontal deflection amplifier from the horizontal coil of the deflection yoke and reconnects it to a dummy yoke or coil which is an inductor having the same inductance as the horizontal coil. The analog switch reconnects the synchronous horizontal deflection amplifier to the horizontal coil of the deflection yoke at the end of the vertical retrace period. This procedure is repeated during every vertical retrace period. By this switching operation and use of a dummy yoke the operation of the synchronous horizontal deflection amplifier is not interrupted.

Because a conventional synchronous horizontal deflection amplifier and oscillator is used a conventional television type high voltage power supply basically consisting of a high voltage rectifier and step-up flyback transformer may be utilized to provide the high D.C. voltage required by the anode of the CRT.

To provide stroke writing of data on the face of the CRT during vertical retrace a linear amplifier amplifying stroke writing signals obtained from a conventional source is also provided which is connected to the horizontal coil of the deflection yoke via the analog switch only during the vertical retrace period. With the linear deflection amplifier being connected to the deflection yoke only a relatively small percentage of the time the power required by the linear amplifier is greatly reduced. In addition, an analog switch is used to connect the vertical oscillator to the linear vertical deflection amplifier during the raster scan period and to connect stroke writing signals obtained from the conventional source during the vertical retrace period.

DESCRIPTION OF THE DRAWING

My invention will be better understood on reading the following detailed description in conjunction with the drawing in which.

DETAILED DESCRIPTION

Figure 1:
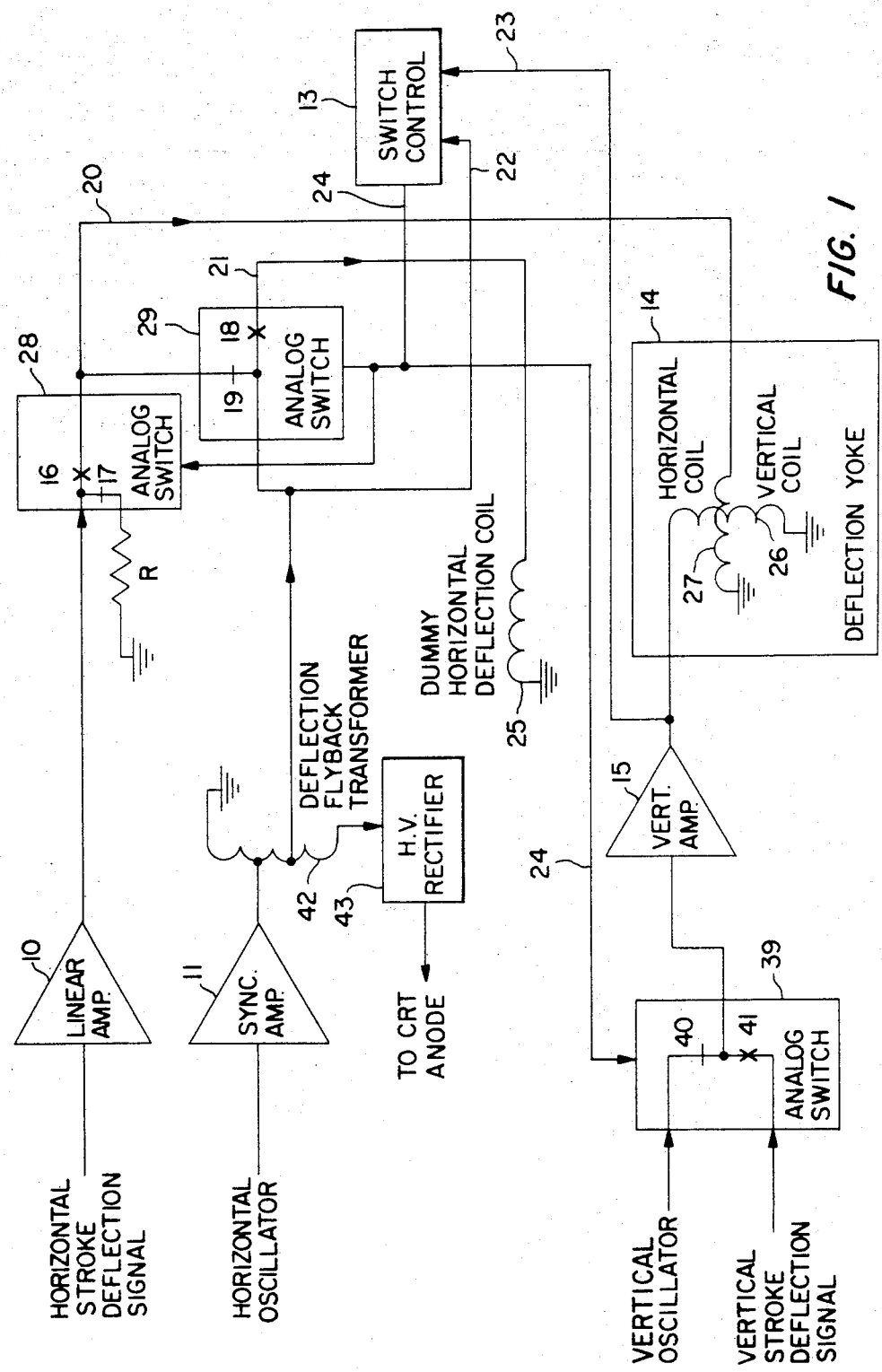
FIG. 1 is a simplified schematic block diagram of the invention.

In FIG. 1 is shown a simplified block diagram of my novel invention which is a modification of the conventional horizontal and vertical raster scan sweep circuits of a television type display. The conventional deflection circuitry comprises the following. A horizontal oscillator (not shown) and synchronous horizontal deflection amplifier 11 are used which generate a periodic ramp current waveform shown in FIG. 2(A) which is the waveform of the current that normally flows in horizontal coil 27 of deflection yoke 14. A vertical oscillator (not shown) and vertical deflection amplifier 15 are used which provide a periodic ramp waveform shown in FIG. 2(C) which is normally applied to vertical coil 26 of deflection yoke 14. Deflection yoke 14 is a modified conventional yoke having lower inductance vertical and horizontal coils 26 and 27 required to be used for both raster scan deflection and stroke writing operation. Finally, a conventional deflection flyback transformer 42 and high voltage rectifier 43 are used to provide the high voltage D.C. voltage required for the CRT anode. All this conventional circuitry operates in a manner well known in the television art and is not described in detail herein.

To this conventional deflection circuitry I add linear amplifier 10, analog switches 28, 29 and 39, switch control 13, dummy horizontal deflection coil 25, and conventional circuitry for providing horizontal and vertical stroke writing signals (not shown). With this additional circuitry switch control 13 functions to control electronic analog switches 28 and 29 to connect the horizontal oscillator (not shown) and synchronous horizontal deflection amplifier 11 to horizontal coil 27 of deflection yoke 14 during the normal raster scan period on the face of a cathode ray tube (not shown). During each normal vertical retrace period, when it is desired to display other information on the face of the cathode ray tube using stroke writing techniques, switch control circuit 13 operates analog switches 28 and 29 to reconnect synchronous amplifier 11 to dummy horizontal deflection coil 25 to permit it to function without interruption, and also to connect linear amplifier 10 to horizontal coil 27 of deflection yoke 14. At all times vertical deflection amplifier 15 is connected to vertical coil 26 of deflection yoke 14 and switch control circuit 13 controls analog switch 39 to change the deflection signal applied to its input signal. Vertical deflection amplifier 15 has the vertical oscillator connected to its input during the normal raster scan period, and has the vertical stroke deflection signal applied to its input during the vertical retrace period. This can be done since vertical amplifier 15 is a linear amplifier that can handle both types of signals. In contrast, synchronous horizontal deflection amplifier 11 is not designed to handle stroke deflection signals so such deflection signals must be applied via linear amplifier 10 to horizontal coil 27. In addition, the use of a linear horizontal deflection amplifier during the vertical retrace period would preclude the use of a simple high voltage power supply in the form of a rectifier and step-up flyback transformer using the high voltage surges created during each horizontal retrace period to provide the high D.C. voltage required by the CRT anode. Accordingly, a relatively expensive high voltage power supply would have to be used to provide the CRT anode voltage. To accommodate this a dummy horizontal deflection coil 25 is connected via analog switch 29 to the output of synchronous horizontal deflection amplifier 11 during the vertical retrace period so that the oscillatory operation of synchronous amplifier 11 may continue uninterrupted and the simple conventional high voltage power supply in the form of high voltage rectifier 43 and step-up flyback transformer 42 may use the high voltage surges created during the horizontal retrace period to provide the high D.C. voltage required by the CRT anode. This precludes the requirement for a relatively expensive high voltage power supply to provide the CRT anode voltage. In analog switches 28, 29 and 39 are shown contacts 16 through 19, 40 and 41. Contacts 16, 18 and 41 are normally open and only close a path therethrough upon the operation of switches 28, 29 and 39 under control circuit 13. Contacts 17, 19 and 40 are normally closed and open the paths through these contacts when analog switches 28, 29 and 39 are operated. In reality analog switches 28, 29 and 39 do not have electromechanical switch contacts such as shown in these switches in FIG. 1. This representation is only for ease of understanding what elements are connected or disconnected during the function of my invention. An example electronic analog switch is the type AD7512D1 analog switch manufactured by Analog Devices Inc. in Norwood, Mass.

Switch control circuit 13 senses the outputs from synchronous horizontal deflection amplifier 11 and vertical deflection amplifier 15 and provides a control signal via lead 24 to operate analog switches 28, 29 and 39 during each vertical retrace period. Switch control circuit 13 releases analog switches 28, 29 and 39 during the normal raster scan period. During normal raster scan the output of synchronous amplifier 11 is connected via normally closed contact 19 and lead 20 to horizontal coil 27 of deflection yoke 14, and the output of linear deflection amplifier 10 is connected via normally closed contact 17 to a dummy load resistance R. During this same period the output of the vertical oscillator (not shown) is connected via normally closed contact 40 of analog switch 39 to the input of vertical deflection amplifier 15 which drives vertical coil 26 of deflection yoke 14. With the connections just described and the signals being applied thereby to deflection yoke 14, the electron beam of the cathode ray tube (not shown) is deflected to accomplish normal raster scanning. The electron beam is intensity modulated in a manner well known in the art to display information on the face of the cathode ray tube.

At the end of the normal raster scanning period, and just before the beginning of the vertical retrace period, switch control circuit 13 operates analog switches 28, 29 and 39 to open contacts 17, 19 and 40 and to close contacts 16, 18 and 41. Accordingly, the output of synchronous amplifier 11 is connected via contact 18 and lead 21 to dummy horizontal deflection coil 25 so that synchronous amplifier 11 along with its horizontal oscillator input, and flyback transformer 42 with high voltage rectifier 43 may all continue to operate in their conventional manner. The stroke deflection signals being amplified by linear amplifier 10 are now connected via contact 16 and lead 20 to horizontal coil 27 of deflection yoke 14. During this same period the output of the vertical oscillator (not shown) is disconnected from the input of vertical deflection amplifier 15 due to the opening of contact 40 and, instead, a vertical stroke deflection signal is input to vertical amplifier 15 via contact 41 to be amplified and applied to vertical coil 26 of deflection yoke 14. In this manner, during the vertical retrace period stroke deflection signals are applied to vertical coil 26 and horizontal coil 27 of deflection yoke 14, while the horizontal oscillator, synchronous horizontal deflection amplifier 11, flyback transformer 42 and high voltage rectifier 43 continue to function normally.

Figure 2:
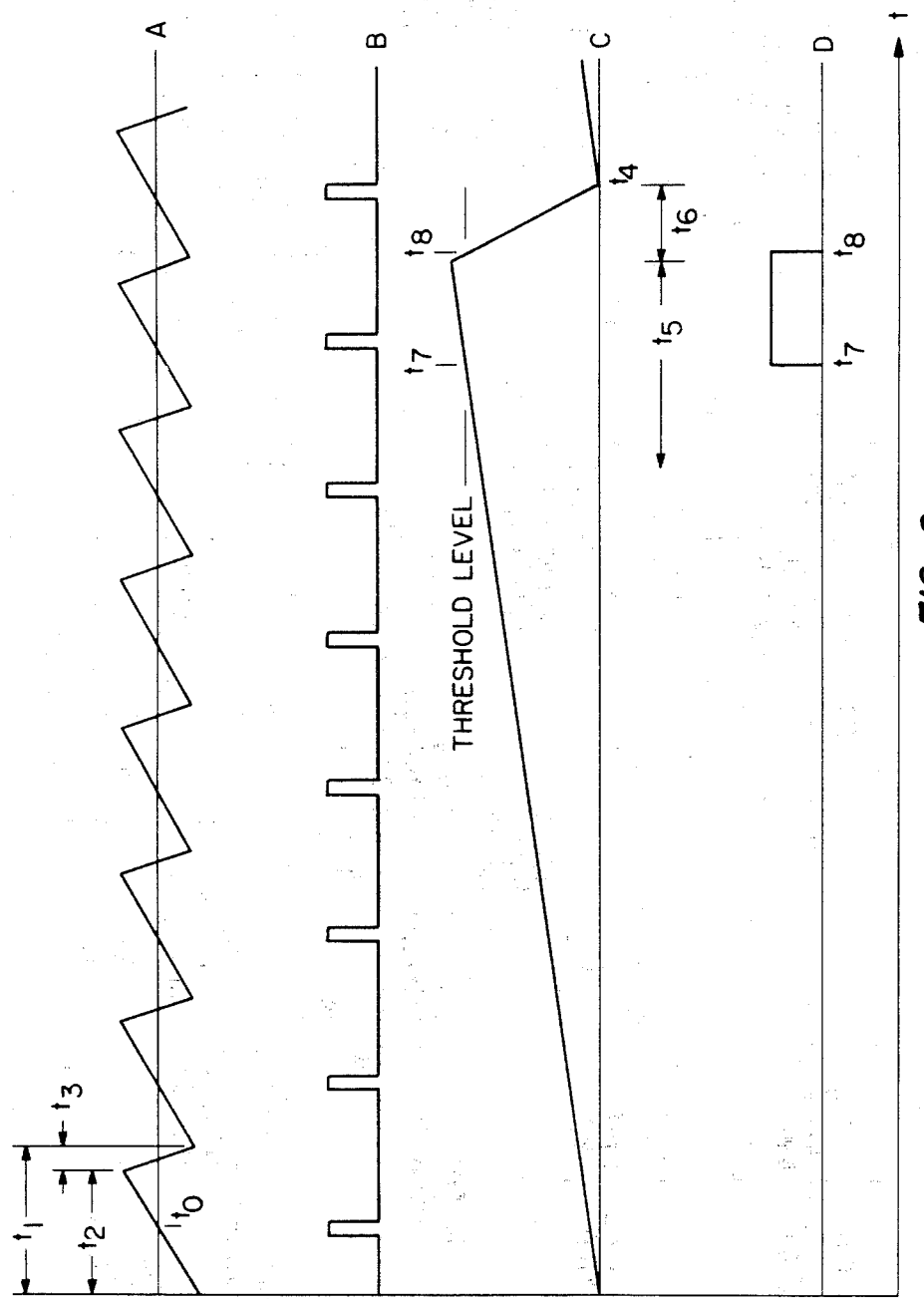
FIG. 2 is a graph showing conventional raster scan horizontal and vertical deflection waveforms and waveforms output from the zero crossing detector and threshold detector in the switch control circuit.

In FIG. 2 are shown four waveforms in FIGS. 2A, 2B, 2C and 2D. FIG. 2A shows a representation of the horizontal deflection current in the horizontal coil of the deflection yoke of a conventional television receiver. This is the same vaveform of the current in horizontal coil 27 of deflection yoke 14 during the normal raster scanning period. It can be seen that the horizontal deflection signal is oscillatory in nature. The time period for one cycle of the horizontal deflection signal, which is the time it takes the electron beam to sweep one horizontal sweep across the face of the cathode ray tube and return and be ready to commence sweeping another horizontal sweep is the time $t_1$ shown in FIG. 2A. Time $t_1$ is further broken down into time $t_2$ which is the time it takes the electron beam to sweep across the face of the CRT for a single horizontal scan. The time $t_3$ is the horizontal retrace time, which is the time in which the electron beam is blanked and retraces from the right hand edge of the face of the CRT back to the left hand edge of the CRT to be ready to commence the next raster scan line.

FIG. 2B shows a number of periodic pulses having the same frequency as the horizontal deflection signal shown in FIG. 2A. These pulse waveforms shown in FIG. 2B are generated by the zero crossing detector 31 in switch control circuit 13 shown in FIG. 3, and is described in detail further in the specification. In FIG. 2A it can be seen that the periodic horizontal deflection signal passes through zero once in the positive sense during horizontal sweep at time $t_0$ and once in the negative sense during horizontal retrace time. Zero crossing detector 31 in switch control circuit 13 in FIG. 3 responds only to a signal passing through zero in the positive sense or direction and generates a pulse which are the pulses shown in waveform 2B. An example of a commercially available zero crossing detector is the GEL300 Zero Voltage Switch available from the General Electric Company.

In FIG. 2C is shown the waveform of a single cycle of the periodic vertical deflection signal output from vertical amplifier 15 to vertical coil 26 of deflection yoke 14 during normal raster scan. The time base in FIG. 2C is not the same as the time base for FIGS. 2A and 2B. As is known in the art there are 262½ horizontal scan lines traced during each vertical trace on the face of the cathode ray tube to make up one scan field. Two interlaced fields make up a 525 scan line frame. The overall time for one vertical deflection waveform is $t_4$, which is made up of the vertical sweep time $t_5$ and the vertical retrace time $t_6$. It is during this vertical retrace time, that the electron beam is normally blanked and is being returned to the upper left hand corner of the cathode ray tube to commense scanning another scan field. It is during this vertical retrace time $t_6$, which is equal approximately to the time it takes to horizontally scan 30 to 40 lines, that stroke writing of information is to be accomplished on the face of the CRT. Also in FIG. 2C is a Threshold Level and two times $t_7$ and $t_8$. As will be described in detail hereinafter with reference to FIG. 3, in switch control 13 is a threshold detector 32 to which the output of the vertical deflection amplifier 15 is applied via lead 23. During the time that the amplitude of the vertical deflection signal exceeds a defined figure, herein the Threshold Level, there is an output from threshold detector 32 the waveform of which is shown in FIG. 2D. The period of time between times $t_7$ and $t_8$ is the period during which the amplitude of the vertical deflection signal exceeds the Threshold Level. A Threshold Level detector may be implemented using a differential amplifier as is well known in the art.

Figure 3:
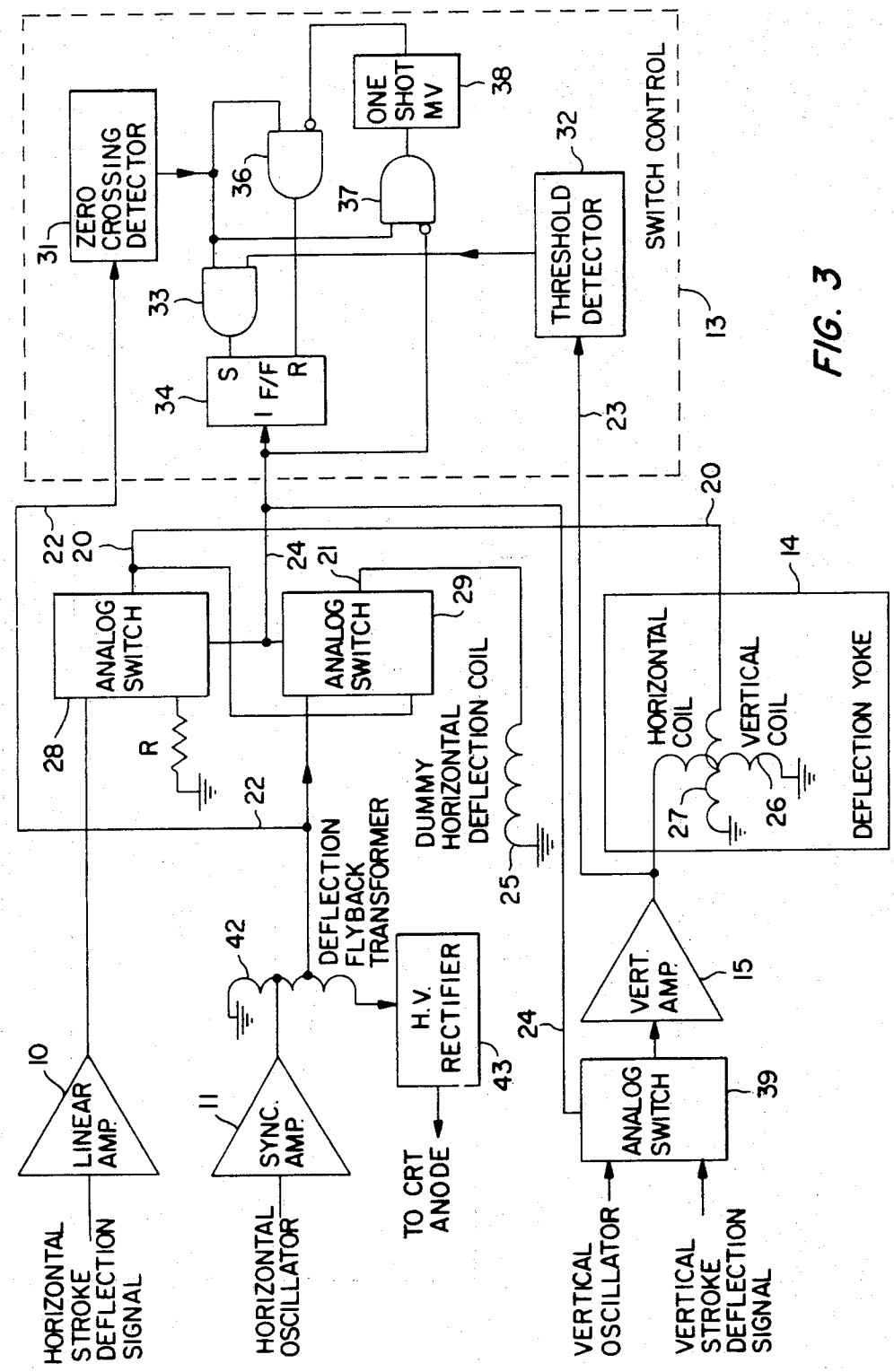
FIG. 3 is a schematic diagram of the invention.

Turning now to FIG. 3, therein is shown a schematic diagram of my invention. Most of the elements are shown in block diagram form because they are known in the prior television receiver art or are well known elements such as linear amplifier 10, analog switches 28, 29 and 39, zero crossing detector 31 and threshold detector 32. The operation of deflection flyback transformer 42 and high voltage rectifier 43 are well known in the art and so are not described. The details of the switching functions of analog switches 28, 29 and 39 were previously described in detail with reference to FIG. 1 wherein contact configurations are shown so only the results of the operation of the switches are summarized as required hereinafter in the specification.

Figure 4:
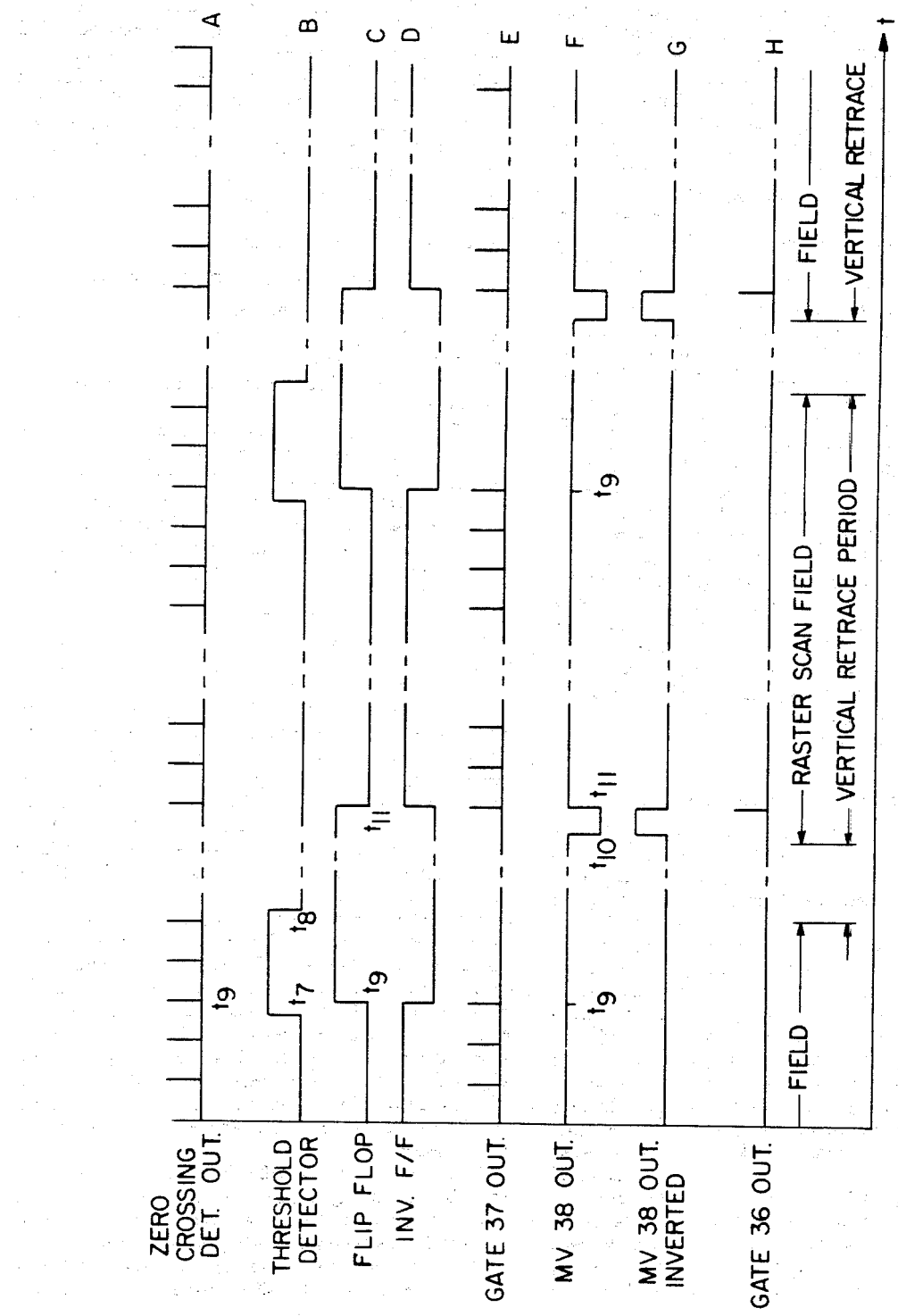
FIG. 4 shows timing diagrams necessary for understanding the operation of the switch control circuit.

The operation of the circuitry within switch control circuit 13 is now described with reference to FIG. 4 in the subfigures of which are shown the timing diagrams necessary to understand the operation of the circuitry within switch control circuit 13. There are two inputs to switch control circuit 13 and one output therefrom. One of the inputs is the horizontal sweep deflection signal and is input via lead 22. The other input is the vertical sweep deflection signal which is input via lead 23. The output from switch control circuit 13 is on lead 24 and is used to operate analog switches 28, 29 and 39. As previously generally described in this specification, switch control circuit 13 operates analog switches 28, 29 and 39 such that during the normal raster scan period the periodic horizontal deflection signal generated by the combination of the horizontal oscillator, synchronous amplifier 11 and deflection flyback transformer 42 is connected through analog switch 29 and over lead 20 to horizontal coil 27 within deflection yoke 14. During this period of time in which a single field is scanned on the face of the cathode ray tube the output of the vertical oscillator is applied through analog switch 39 and vertical amplifier 15 to vertical coil 26 of deflection yoke 14. At the end of the scan field, at the beginning of the vertical retrace period switch control 13 operates analog switches 28, 29 and 39 to connect the periodic horizontal deflection signals to dummy horizontal deflection coil 25 and to connect the horizontal stroke deflection signals amplified by linear amplifier 10 to horizontal coil 27 of deflection yoke 14, and to connect the vertical stroke deflection signals amplified by vertical amplifier 15 to vertical coil 26 of deflection yoke 14. With reference to FIG. 2A, the switching action to operate or release analog switches 28, 29 and 39 is accomplished when the horizontal raster deflection signal is passing through zero at time $t_0$ in order to avoid transients that disrupt the operation of the circuitry. Accordingly, zero crossing detector 31 in circuit 13 monitors the horizontal raster deflection signal and provides the pulse output shown in FIG. 2B each time the horizontal raster deflection signal pass through zero in the positive sense such as at time $t_0$. These pulse signals generated by zero crossing detector 31 are used to synchronize the operation of the other circuitry within switch control circuit 13 to assure that analog switches 28, 29 and 39 are operated and released only in synchronization with the occurrence of a positive sense zero crossing of the horizontal raster deflection signals to avoid transient problems.

In FIG. 4A is another representation of the pulses generated by zero crossing detector 31 responsive to each cycle of the horizontal raster deflection signal. The time base of FIG. 4A is merely different than the time base of the same pulses shown in FIG. 2B.

As described briefly heretofore threshold detector 32 monitors the vertical raster deflection signals and provides an output during the time when the amplitude of the vertical raster deflection signal exceeds a predetermined Threshold Level between times $t_7$ and $t_8$ as shown in FIG. 4B. Thus, there is an output from threshold detector 32 starting immediately before the end of the vertical raster deflection signal to indicate that the vertical retrace period is about to start. It should be noted that there are two output signals from threshold detector 32 shown in FIG. 4B indicating that there are two vertical trace periods. The breaks within the time base of each of the waveforms of FIG. 4A through 4H are necessary to accurately show the operation of the circuitry within switch control circuit 13. For example, within the actual period of time between times $t_9$ and $t_{11}$ shown in FIG. 4C there occur in the order of 40 pulses from zero crossing detector 31. As this would be difficult to show the dotted lines are used on the time base. Similarly, during a raster scan field there are in the order of 262 pulses from zero crossing detector 31, almost all of which are deleted by the use of the dotted lines on the time base.

Before continuing with a description of the circuitry within switch control circuit 13, I briefly mention a few of the individual circuits used therein that have not been mentioned heretofor. Gates 33, 36 and 37 are known in the art and include inverting inputs which are used as shown in FIG. 3. Flip-flop 34 is well known in the art and is a flip-flop having a set input S and a reset input R, and when a pulse is applied to the set input S the output of this flip-flop goes to a one state and remains there until a pulse is applied to the reset input R of flip-flop 34 at which time the output goes to a zero state. One-shot multivibrator 38 is also well known in the art and functions such that when a pulse is applied to its input its output goes to a one state for a given period of time at the end of which it returns to a zero state. In addition, if multiple pulses are applied to the input of one-shot multivibrator 38 before the time out period for this multivibrator the timing period will be restarted by each pulse.

Upon threshold detector 32 detecting that the vertical raster deflection signal is near its peak, indicating the end of the vertical deflection period, there is the output from detector 32 commencing at time $t_7$ as shown in FIG. 4B. The output from detector 32 ends at time $t_8$ very shortly after the beginning of the vertical retrace period. Within the time period between times $t_7$ and $t_8$ approximately three horizontal scan lines occur as represented by the pulses in FIG. 4A starting at time $t_9$. There is no information displayed on the face of the cathode ray tube during these last few scan lines. The output from threshold detector 32, which is at a one state between times $t_7$ and $t_8$, is connected to one of the two inputs of AND gate 33. The other input of AND gate 33 is connected to the output of zero crossing detector 31 which provides an output for each cycle of the horizontal deflection signal as shown in FIG. 4A. The result is that there is an output from AND gate 33 only when both inputs are at a one state. This occurs for the three zero crossing pulses output from zero crossing detector 31 starting at time $t_9$ as shown in FIG. 4A. The first output pulse occurring at time $t_9$ is applied to the set input S of flip-flop 34 and sets this flip-flop so that its output goes to a one state. This output from flip-flop 34 is applied via lead 24 to operate analog switches 28, 29 and 39. The operation of flip-flop 34 is represented by the waveform in FIG. 4C. It can be seen in FIG. 4C that the operation of flip-flop 34 is synchronized with the zero crossing pulses and goes to its one state starting at time $t_9$. Flip-flop 34 remains in its one state until a time $t_{11}$ that is also synchronized with a zero crossing and occurs shortly after the end of the vertical retrace period.

The output of flip-flop 34 is also connected to the inverting input of AND gate 37. Due to the operation of the inverting input of AND gate 37 the waveform of the signal actually applied to this input is inverted as shown in FIG. 4D. It is merely an inversion of the waveform shown in FIG. 4C. The second uninverted input of AND gate 37 is connected to the output of zero crossing detector 31 and therefore has the zero crossing pulses shown in FIG. 4A applied thereto. Before the operation of flip-flop 34, which is prior to time $t_9$, due to the inverting action of the inverting input of AND gate 37, the inverting input is at a one state. Thus, upon the occurrence of each pulse output from zero crossing detector 31 there is a pulse output from AND gate 37 as shown in FIG. 4E which pulses are applied to the triggering input of one-shot multivibrator 38. As the time between each of the pulses applied to the triggering input of multivibrator 38 is shorter than its time out period, the multivibrator starts its timing period with each pulse but does not finish timing out so its output remains in its one state. Each subsequent pulse restarts the timing period of one-shot multivibrator 38 until flip-flop 34 is operated causing the inverting input of AND gate 37, after inversion, to go to its zero state which blocks further pulses from being output from AND gate 37. This operation is shown in FIG. 4E. Thus, the last pulse output from AND gate 37 at time $t_9$ restarts the timing sequence of one-shot multivibrator 38 which now finishes timing out at time $t_{10}$ and the output of multivibrator 38 then goes to its zero state as shown in FIG. 4F. The output of one-shot multivibrator 38 is connected to the inverting input of the two inputs and AND gate 36. Due to the inverting action, when the output of one-shot multivibrator 38 is in its one state up time $t_{10}$, as shown in FIG. 4F, the inverted input of AND gate 36 is at its zero state as shown in FIG. 4G. This prevents any signal from passing through AND gate 36. The second input of AND gate 36 is uninverted and is connected to the output of zero crossing detector 31 to have the zero crossing pulses input thereto. Thus, after one-shot multivibrator 38 times out at time $t_{10}$ the inverted input of AND gate 36 goes to its one state and the next occurring zero crossing pulse output from zero crossing detector 31 passes through AND gate 36 as shown in FIG. 4H. This pulse passed through AND gate 36 is applied to the reset input R of flip-flop 34 causing the flip-flop to be reset and its output goes back to its zero state. This results in the release of analog switches 28, 29 and 39. The time out period of multivibrator 38 is designed such that it times out at time $t_{10}$ which occurs immediately after the end of the vertical retrace period as shown in FIG. 4F. Thus, with the operation of the circuitry within switch control circuit 13 as just described analog switches 28, 29 and 39 are operated immediately prior to the occurrence of the vertical retrace period and are released immediately after the end of the vertical retrace period. Both the operation and release of analog switches 28, 29 and 39 occur on the appearance of a positive sense zero crossing of the horizontal deflection signals.

Due to inherent propogation delays in the operation of switch control circuit 13 analog switches may be operated and released a moment after the actual horizontal raster deflection signals zero crossing. To compensate for this delay an offset bias may be applied to zero crossing detector 31 which causes it to trigger and provide a pulse output immediately before each zero crossing. Thus, even with the propogation delays analog switches 28, 29 and 39 are operated upon the actual occurrence of zero crossings.

While what has been described hereinabove is a preferred embodiment of the invention those skilled in the art will realize that many changes may be made without departing from the spirit and scope of the invention. For instance timing circuitry may be utilized in switch control circuit 13 rather than the circuitry shown.

What is claimed is:

1. A deflection amplifier arrangement for a raster scan video display having a cathode ray tube (CRT) with a deflection yoke including horizontal and vertical deflection coils, said arrangement permitting raster scanning responsive to vertical and horizontal periodic scanning signals and raster scan writing of information is accomplished during raster scanning, said arrangement also permitting stroke writing of information responsive to vertical and horizontal stroke writing signals during the vertical retrace period between raster scanning periods, the amplifier arrangement comprising:

an inductor having an inductance substantially equal to that of the horizontal coil of said deflection yoke, an amplifier amplifying said horizontal stroke writing signals applied to the horizontal coil of said deflection yoke during the vertical retrace period, and switch means that during raster scanning connects said horizontal scanning signals to said horizontal coil and said vertical scanning signals to said vertical coil and during the vertical retrace period connects the horizontal scanning signals to said inductor, said horizontal stroke writing signals to said horizontal coil and said vertical stroke writing signals to said vertical coil to accomplish stroke writing of information.

2. The invention in accordance with claim 1 wherein said switch means comprises:

a plurality of analog switches, and a switch control means responsive to said horizontal and vertical scanning signals to operate said analog switches substantially at the beginning of the vertical retrace period to accomplish stroke writing of information and to release said analog switches substantially at the beginning of raster scanning to accomplish raster scan writing of information.

3. The invention in accordance with claim 2 wherein said amplifier comprises a linear amplifier.

4. The invention in accordance with claim 3 wherein said plurality of analog switches comprises:

a first analog switch operable by said switch control means to alternately connect said vertical scanning signals to said vertical coil during the raster scanning period, and to connect said vertical stroke writing signals to said vertical coil during the vertical retrace period.

5. The invention in accordance with claim 4 wherein said plurality of analog switches further comprises:

a second analog switch operable by said switch control means to alternately connect said horizontal scanning signals to said horizontal coil during the raster scanning period, and to connect said horizontal scanning signals to said inductor during the vertical retrace period.

6. The invention in accordance with claim 5 further including a resistor and wherein said plurality of analog switches further comprises:

a third analog switch operable by said switch control means to alternately connect the output of said horizontal stroke writing signal amplifier to said horizontal coil during the vertical retrace period and to said resistor during the raster scanning period.

7. The invention in accordance with claim 6 wherein said switch control means comprises:

means for sensing when the current flow through said horizontal coil created by each cycle of said horizontal periodic scanning signal is zero, said switch control means operating and releasing said analog switch means only when said sensing means indicates that the current flow through said horizontal deflection coil is zero.

8. The invention in accordance with claim 6 further comprising:

a flyback transformer to which said horizontal scanning signals are applied before being applied to said horizontal coil during raster scanning, and a high voltage rectifier for rectifying current in said transformer during the horizontal retrace period to produce a high D.C. voltage for the anode of said CRT.

* * * * *